(12) United States Patent
Wintzer et al.

(10) Patent No.: US 9,864,181 B2
(45) Date of Patent: Jan. 9, 2018

(54) SOLAR CONCENTRATOR AND PRODUCTION METHOD THEREOF

(75) Inventors: Wolfram Wintzer, Jena (DE); Peter Mühle, Jena (DE); Lars Arnold, Neustadt (DE); Alois Willke, Buseck (DE); Hagen Goldammer, Jena (DE); Andreas Baatzsch, Jena (DE)

(73) Assignee: Docter Optics SE, Neustadt an der Orla (DE)

( * ) Notice: Subject to any disclaimer, the term of this patent is extended or adjusted under 35 U.S.C. 154(b) by 935 days.

(21) Appl. No.: 13/505,222

(22) PCT Filed: Sep. 18, 2010

(86) PCT No.: PCT/EP2010/005755
§ 371 (c)(1),
(2), (4) Date: Apr. 30, 2012

(87) PCT Pub. No.: WO2011/050886
PCT Pub. Date: May 5, 2011

(65) Prior Publication Data
US 2012/0241000 A1    Sep. 27, 2012

(30) Foreign Application Priority Data
Oct. 30, 2009   (DE) .................. 10 2009 051 407

(51) Int. Cl.
*C03B 19/00* (2006.01)
*H01L 31/0232* (2014.01)
(Continued)

(52) U.S. Cl.
CPC .......... *G02B 19/0028* (2013.01); *C03B 11/07* (2013.01); *F24J 2/067* (2013.01);
(Continued)

(58) Field of Classification Search
CPC .......... C03B 11/04; C03B 11/07; C03B 11/08; C03B 2215/61; C03B 2215/65
See application file for complete search history.

(56) References Cited

U.S. PATENT DOCUMENTS 4,361,429 A * 11/1982 Anderson et al. ................ 65/67
4,830,678 A    5/1989 Todorof
(Continued)

FOREIGN PATENT DOCUMENTS

DE         1921144 A1    9/1964
DE        10020396 A1   11/2001
(Continued)

OTHER PUBLICATIONS

Machine Translation of DE10305059 Accessed at esp@cenet on Nov. 14, 2014.*
(Continued)

*Primary Examiner* — Jason L Lazorcik
(74) *Attorney, Agent, or Firm* — Barnes & Thornburg LLP

(57) ABSTRACT

The invention relates to a solar concentrator comprising a solid body consisting of a transparent material that has a light coupling surface and a light decoupling surface, the solid body having a light guide part that tapers towards the light decoupling surface, being located between the light coupling surface and the light decoupling surface and being delimited by a light guide surface between the light coupling surface and the light decoupling surface, the light guide surface merging into the light decoupling surface with a constant first derivation. The invention also relates to a method for the production of a solar concentrator, wherein the transparent material is precision-molded between the molds.

11 Claims, 5 Drawing Sheets

(51) Int. Cl.

| | | |
|---|---|---|
| *G02B 3/02* | (2006.01) | |
| *G02B 19/00* | (2006.01) | |
| *C03B 11/07* | (2006.01) | |
| *F24J 2/06* | (2006.01) | |
| *F24J 2/08* | (2006.01) | |
| *F24J 2/15* | (2006.01) | |
| *H01L 31/052* | (2014.01) | |
| *H01L 31/054* | (2014.01) | |
| *G02B 6/42* | (2006.01) | |

(52) U.S. Cl.
CPC ................ *F24J 2/085* (2013.01); *F24J 2/15* (2013.01); *G02B 19/0042* (2013.01); *H01L 31/052* (2013.01); *H01L 31/0543* (2014.12); *G02B 6/4298* (2013.01); *Y02E 10/43* (2013.01); *Y02E 10/52* (2013.01)

(56) References Cited

U.S. PATENT DOCUMENTS

| 6,295,172 | B1 | 9/2001 | Yamamichi | |
|---|---|---|---|---|
| 7,771,815 | B2* | 8/2010 | Shyu et al. | 428/157 |
| 2005/0268660 | A1* | 12/2005 | Hosoe et al. | 65/102 |
| 2009/0101207 | A1 | 4/2009 | Milbourne et al. | |
| 2009/0217703 | A1* | 9/2009 | Fueller | 65/79 |
| 2010/0040821 | A1* | 2/2010 | Shyu et al. | 428/64.1 |
| 2012/0217663 | A1* | 8/2012 | Wintzer et al. | 264/1.24 |
| 2012/0241000 | A1* | 9/2012 | Wintzer et al. | 136/259 |
| 2013/0160852 | A1* | 6/2013 | Wintzer et al. | 136/259 |
| 2013/0239619 | A1* | 9/2013 | Wintzer et al. | 65/85 |
| 2014/0033767 | A1* | 2/2014 | Wintzer et al. | 65/83 |

FOREIGN PATENT DOCUMENTS

| DE | 10034507 C | 2/2002 |
|---|---|---|
| DE | 10305059 A1 | 2/2004 |
| DE | 102010047335 B4 | 1/2012 |
| EP | 0987225 A2 | 3/2000 |
| EP | 1396035 B4 | 1/2008 |
| EP | 2264785 A2 | 12/2010 |
| EP | 2278631 A1 | 1/2011 |
| JP | 11157853 A | 6/1999 |
| WO | 2008122047 A1 | 10/2008 |
| WO | 2010012474 A1 | 2/2010 |

OTHER PUBLICATIONS

Machine Translation of DE10020396 Accessed at esp@cenet on Nov. 14, 2014.*
English Language Translation of DE 10-020396.*
English Language Translation of DE 10-305059.*
International Preliminary Report on Patentability issued in connection with PCT/EP2010/005755.
International Preliminary Report on Patentability issued in connection with PCT/EP2010/006279.
PCT International Search Report issued in connection with PCT/EP2010/005755 completed Nov. 24, 2011.
PCT International Search Report issued in connection with PCT/EP2010/006279 completed Nov. 25, 2011.

* cited by examiner

SOLAR CONCENTRATOR AND PRODUCTION METHOD THEREOF

CROSS REFERENCE TO RELATED APPLICATIONS

This application is the U.S. national phase of PCT/EP2010/005755 filed Sep. 18, 2010. PCT/EP2010/005755 claims the benefit under the Convention of German Patent Application No. 10 2009 051 407.4 filed Oct. 30, 2009.

FIELD OF THE INVENTION

The invention concerns a solar concentrator made from transparent material, wherein the solar concentrator comprises a light entry (sur)face, a light exit (sur)face, and a light guide portion arranged between the light entry surface and the light exit surface (it should be noted that in context with the light entry and light exit areas described and outlined in the following specification and claims the term "face", only, is used for the sake of simplicity and is to include the term and meaning of "surface" as well) and tapering in the direction of the light exit face, which light guide portion is restricted by a light guide portion surface between the light entry face and the light exit face. The invention, moreover, concerns a method for manufacturing such a solar concentrator.

BACKGROUND INFORMATION

FIG. 1 shows a known solar concentrator 101 which is depicted in FIG. 2 by way of a cross-sectional representation. The solar concentrator 101 comprises a light entry face 102 and a ground light exit face 103 as well as a light guide portion 104 arranged between the light entry face 102 and the light exit face 103 and tapering in the direction of the light exit face 103. Reference numeral 105 denotes a light guide portion surface which restricts the light guide portion 104 between the light entry face 102 and the light exit face 103.

Document EP 1 396 035 B1 discloses a solar concentrator module comprising, on its frontal side, a front lens and, on its rear side, a receiver cell, and, between the front lens and the receiver cell, a reflector which has inclined side walls along two opposing sides of the receiver cell, and, in the center of the module, a flat vertical reflector.

It is an object of the invention to reduce the costs for manufacturing solar concentrators. It is a further object of the invention to produce solar concentrators of a particularly high quality within a restricted budget.

SUMMARY

The aforementioned object is achieved by a method for producing a solar concentrator from transparent material, wherein the solar concentrator comprises a light entry face, a light exit face and a light guide portion arranged between the light entry face and the light exit face and tapering (linearly or non-linearly) in the direction of the light exit face, which light guide portion is restricted by a light guide portion surface between the light entry face and the light exit face, wherein, between a first mold, adapted for molding the light entry face, and at least one second mold, adapted for molding the light exit face, the transparent material is blank molded, in particular two-sidedly, for creating the solar concentrator, and wherein the transparent material, particularly at the beginning of exerting the molding pressure onto the transparent material, is drawn into the second mold by means of a partial vacuum, low pressure, pressure below atmosphere, and/or underpressure.

In the sense of the invention, a solar concentrator is a secondary concentrator. In the sense of the invention, transparent material is particularly glass. In the sense of the invention, the term blank molding is, in particular, to be understood in a manner that an optically operative surface is to be molded under pressure such that any finishing or further treatment of its contour may be dispensed with or does not apply or will not have to be provided for. Consequently, it is particularly provided that, after blank molding, the light exit face is not ground, i.e. it will not be treated by grinding.

A light guide portion surface, when taken in the sense of the invention, is, in particular, inclined by at least 0.1° with respect to the optical axis of the solar concentrator. A light guide portion surface, in the sense of the invention, is, in particular, inclined by no more than 3° with respect to the optical axis of the solar concentrator. An optical axis of the solar concentrator s, in particular, an orthogonal or the orthogonal of the light exit face. The light guide portion surface may be coated.

It is, in particular, provided that the transparent material be cut as liquid glass and positioned within the second mold such that the cutting grain or seam lies outside the optical area. In squeeze or pressure molding it is, in particular, provided that the first mold and the second mold are positioned in relation to each other and are moved to approach each other. After pressure molding it is, in particular, provided that the solar concentrator is cooled on an appropriate support means on a cooling conveyor. According to an expedient embodiment the solar concentrator has a supporting frame. Herein, it is, in particular, provided that fluctuations in weight of the supplied liquid glass are adjusted by varying the support flange. It may also be provided that a heat treatment cycle is applied in which a part of excessive glass will be collected and thereafter (following the removal from the mold) heating will be performed on the flange with an extremely hot flame until this portion drops off.

In a further embodiment of the invention, the transparent material, in particular in the outer region of the material is drawn into the second mold by means of the depression at least partially during said blank molding. In a further embodiment of the invention, the depression is at least 0.5 bar. In a further embodiment of the invention, the depression corresponds, in particular, to vacuum. In a further embodiment of the invention, the transparent material has a viscosity of no more than $10^{4.5}$ (dPa)(s) immediately before molding.

In a further embodiment of the invention, the first mold is heated and/or cooled. In a further embodiment of the invention, the second mold is heated and/or cooled.

In a further favorable embodiment of the invention, the second mold is at least two-part. In a further embodiment of the invention, the second mold has a gap, particularly a circumferential gap, specifically an annular gap, in the region forming the transition between the light exit face and the light guide portion surface. Herein, it is, in particular, provided that the gap is or will be formed between a first component of the second mold and a second component of the second mold. In a further embodiment of the invention the gap has a width of between 10 μm and 40 μm. In a further expedient embodiment of the invention, the depression is generated in said gap.

The aforementioned object is, moreover, achieved by a method for producing a solar module, wherein a solar concentrator produced by a method according to any one of the preceding features is, with its light exit face, connected to, in particular cemented to a photovoltaic element (for generating electric energy from sunlight), and/or is fixedly aligned with respect to a photovoltaic element (for generating electric energy from sunlight).

The aforementioned object is, furthermore, achieved by a solar concentrator in particular produced in accordance with a method according to any one of the preceding features and having a solid body from transparent material, which comprises a light entry face and a light exit face, wherein the solid body comprises a light guide portion between the light entry face and the light exit face tapering (linearly or non-linearly) in the direction of the light exit face, which light guide portion is restricted between the light entry face and the light exit face by a light guide portion surface, and wherein the light guide portion surface merges into the light exit face with a continuous first derivative.

The aforementioned object is, furthermore, achieved by a solar concentrator in particular produced in accordance with a method according to any one of the preceding features and made from transparent material, wherein the solar concentrator comprises a light entry face, a light exit face, and a light guide portion arranged between the light entry face and the light exit face and tapering (linearly or non-linearly) in the direction of the light exit face, which light guide portion is restricted between the light entry face and the light exit face by a light guide portion surface, and wherein the light guide portion surface merges into the light exit face with a continuous first derivative.

In an embodiment of the invention the light guide portion surface merges into the light exit face with a curvature the radius of which amounts to no more than 0.25 mm, in particular to no more than 0.15 mm, preferably to no more than 0.1 mm.

The aforementioned object is, in addition, achieved by a solar concentrator in particular produced in accordance with a method according to any one of the preceding features and having a solid body from transparent material, which comprises a light entry face and a light exit face, wherein the solid body comprises a light guide portion arranged between the light entry face and the light exit face and tapering (linearly or non-linearly) in the direction of the light exit face, which light guide portion is restricted by a light guide portion surface between the light entry face and the light exit face, wherein the light guide portion surface merges into the light exit face with a curvature, the radius of curvature of which is no more than 0.25 mm, in particular no more than 0.15 mm, preferably no more than 0.1 mm.

The aforementioned object is, furthermore, achieved by a solar concentrator in particular produced in accordance with a method according to any one of the preceding features and made from transparent material, which solar concentrator comprises a light entry face, a light exit face, and a light guide portion arranged between the light entry face and the light exit face and tapering (linearly or non-linearly) in the direction of the light exit face, which light guide portion is restricted by a light guide portion surface between the light entry face and the light exit face, and wherein the light guide portion surface merges into the light exit face with a curvature, the radius of curvature of which is no more than 0.25 mm, in particular no more than 0.15 mm, preferably no more than 0.1 mm.

In a further expedient embodiment of the invention the radius of curvature is more than 0.04 mm. In a further embodiment of the invention the light exit face is blank molded. In a further embodiment of the invention the preferably curved transition from the light guide portion surface into the light exit face is blank molded.

In a further embodiment of the invention, the light entry face is blank molded. In a further embodiment of the invention, the light entry face is convex or planar. The light entry face may be shaped non-spherical or spherical. In a further embodiment of the invention, the light exit face is planar. A planar light entry face or light exit face may show a deviation of contour with respect to an ideal plane particularly based on shrinkage and in particular being concave, which deviation may amount up to 20 μm or even up to 40 μm. It may also be provided that the light entry face is designed as a free form. Moreover it may be provided that the light exit face is designed to be concave.

The aforementioned object is, in addition, achieved by a solar concentrator in particular produced in accordance with a method according to any one of the preceding features and having a solid body from transparent material, which comprises a light entry face and a light exit face, wherein the solid body comprises a light guide portion arranged between the light entry face and the light exit face and tapering (linearly or non-linearly) in the direction of the light exit face, and wherein the light exit face is blank molded.

The aforementioned object is, furthermore, achieved by a solar concentrator in particular produced in accordance with a method according to any one of the preceding features and made from transparent material, which solar concentrator comprises a light entry face, a light exit face, and a light guide portion arranged between the light entry face and the light exit face and tapering (linearly or non-linearly) in the direction of the light exit face, and wherein the light exit face is blank molded.

In a further embodiment of the invention, the light entry face is blank molded. In a further embodiment of the invention, the light entry face is convex or planar. The light entry face may be shaped non-spherical or spherical. In a further embodiment of the invention, the light exit face is planar. A planar light entry face or light exit face may show a deviation of contour with respect to an ideal plane particularly based on shrinkage and in particular being concave, which deviation may amount up to 20 μm or even up to 40 μm. It may also be provided that the light entry face is designed as a free form. Moreover it may be provided that the light exit face is designed to be concave.

Further advantages and details of the present invention will become apparent from the following description of preferred examples of embodiment.

DETAILED DESCRIPTION

Figure 1:
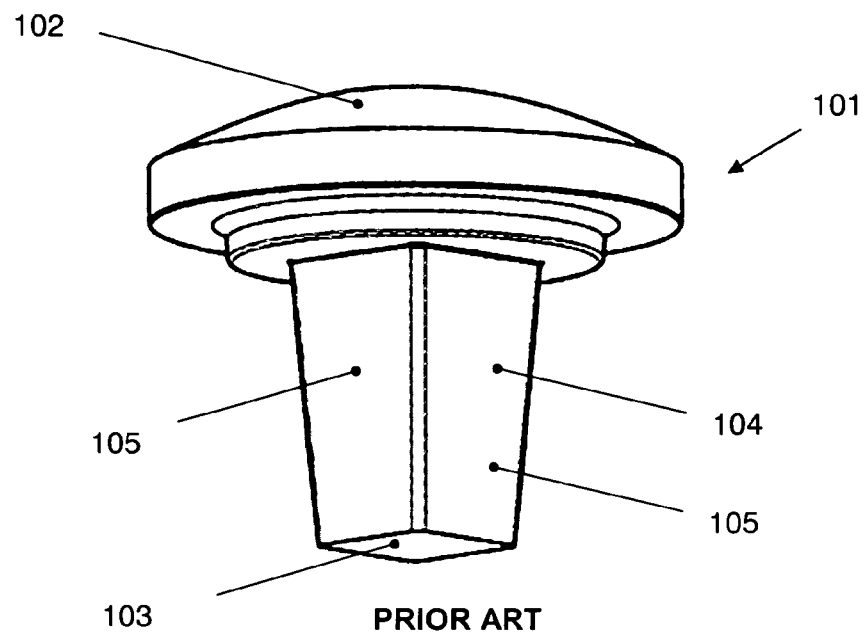
FIG. 1 shows a perspective representation of a known solar concentrator.
Figure 2:
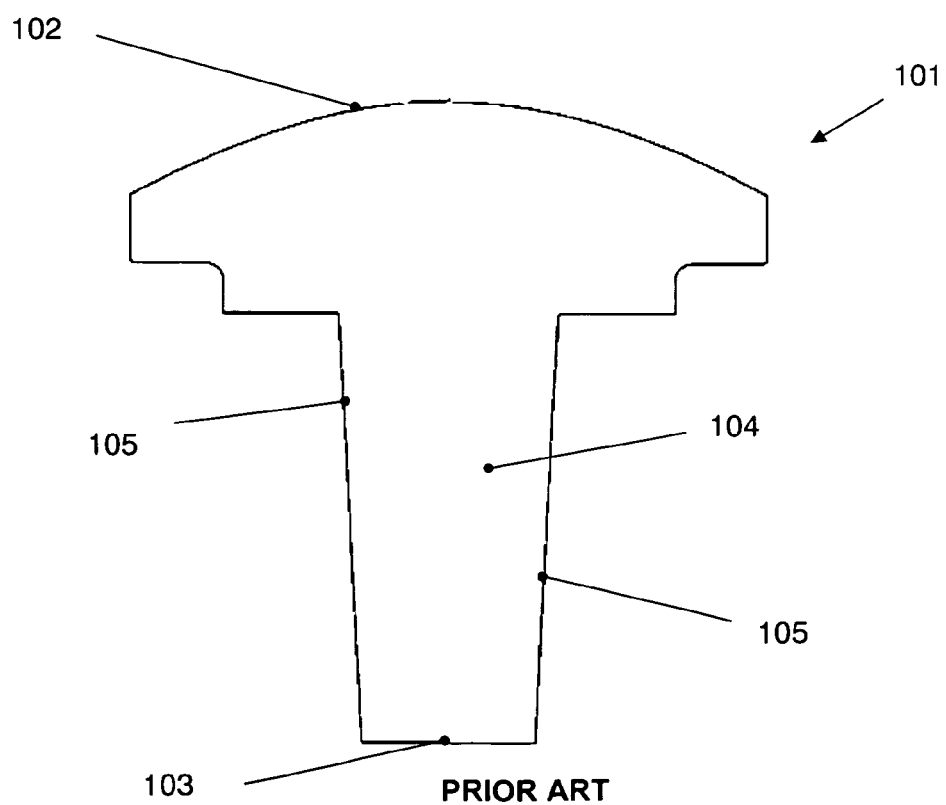
FIG. 2 shows a cross-sectional representation of the solar concentrator as shown in FIG. 1.
Figure 3:
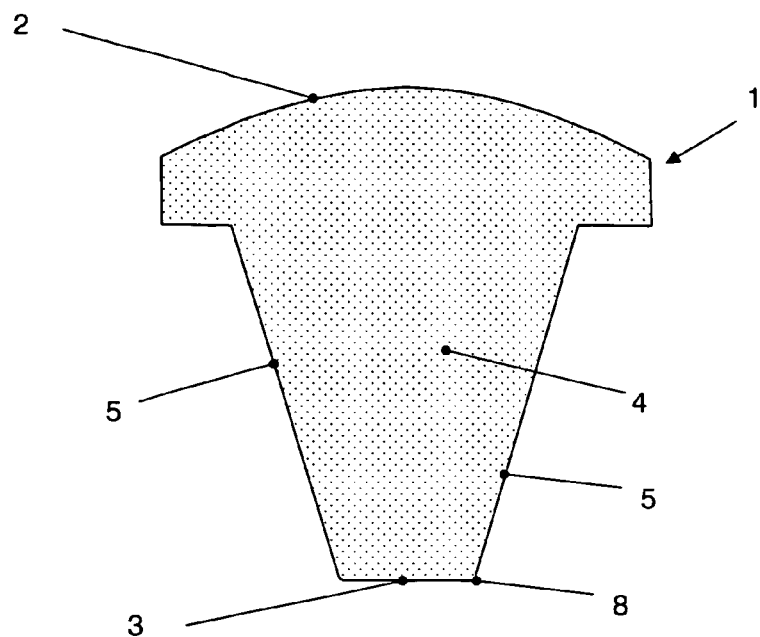
FIG. 3 shows an example of embodiment of a solar concentrator in accordance with the present invention.
Figure 5:
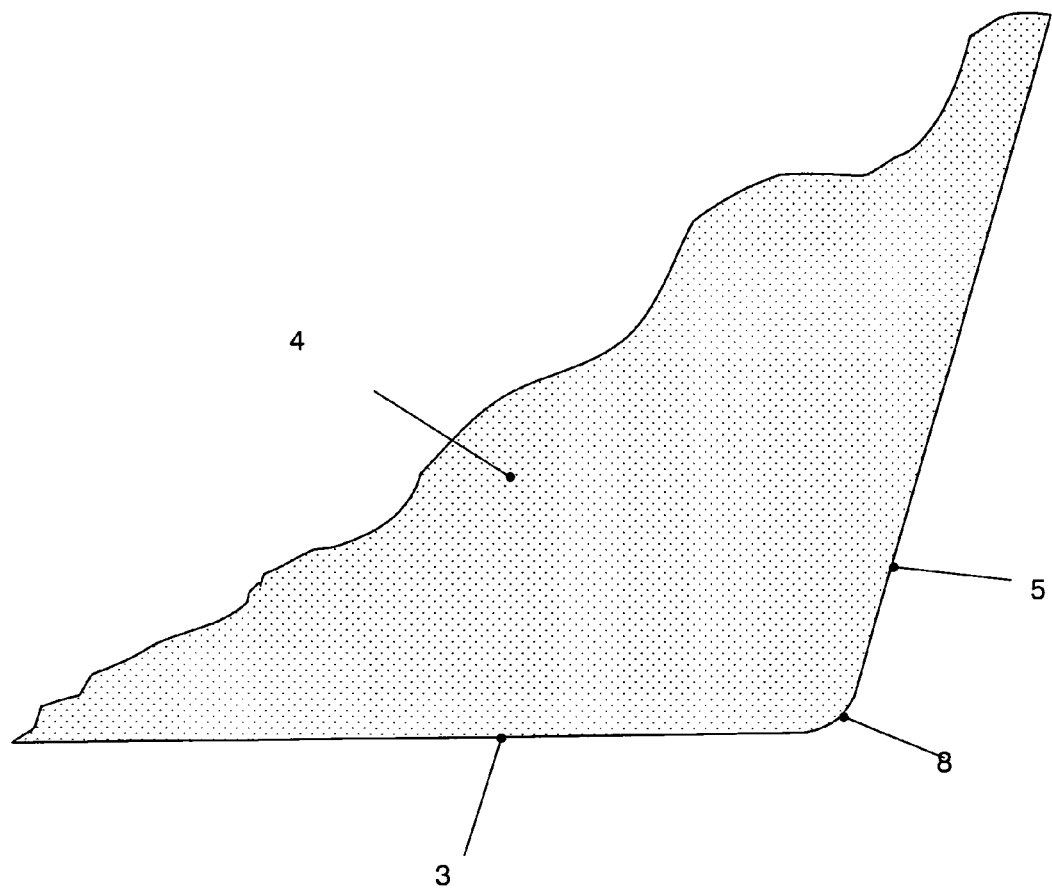
FIG. 5 shows an enlarged cut-out of a solar concentrator in accordance with FIG. 3.

FIG. 3 shows, by way of a cross-sectional representation, an example of embodiment of a solar concentrator 1 according to the present invention. The solar concentrator comprises a light entry (sur)face 2 and a blank-molded light exit (sur)face 3 as well as a light guide portion 4 arranged between the light entry face 2 and the light exit face 3 and tapering in the direction of the light exit face 3. Reference numeral 5 designates a light guide portion surface which restricts the light guide portion 4 between the light entry face 2 and the light exit face 3. Herein, the light guide portion surface 5 merges—as has been represented in greater Detail in FIG. 5—into the light exit face with a curvature 8 whose radius of curvature is approximately 0.1 mm. The protruding press flange or excess-press material, respectively, is removed (mechanically and/or thermally) after molding under pressure.

Figure 4:
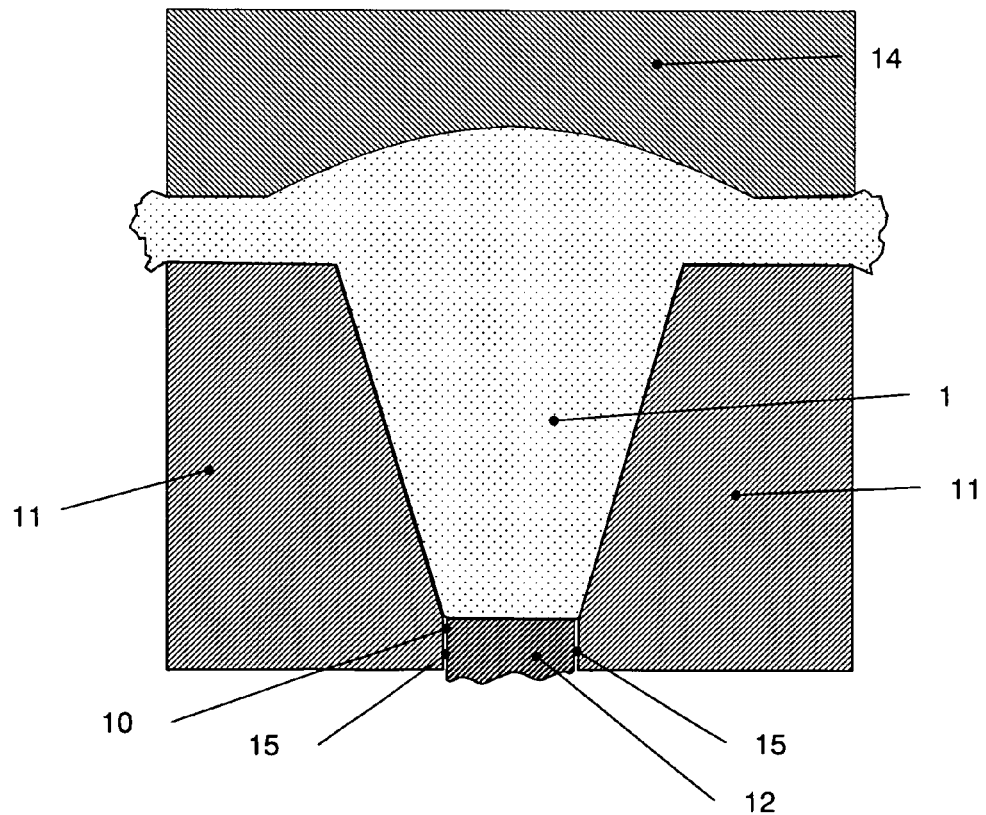
FIG. 4 shows a method for manufacturing a solar concentrator in accordance with FIG. 3.

FIG. 4 shows a method for manufacturing a solar concentrator 1 according to FIG. 3. Herein, liquid glass having a viscosity of no more than $10^{4.5}$ (dPa)(s) is fed into a mold 10 and, by means of a mold 14, pressed resp. molded under pressure into the shape of the solar concentrator 1. The mold 10 comprises a partial mold 11 and a partial mold 12 which, in a centered manner, is arranged within the partial mold 11. A circumferential gap 15 is provided between the partial mold 11 and the partial mold 12, which gap has a width of between 10 μm and 40 μm. In the circumferential gap 15 a depression in the order of a vacuum is generated when pressing together the molds 10 and 14.

Figure 6:
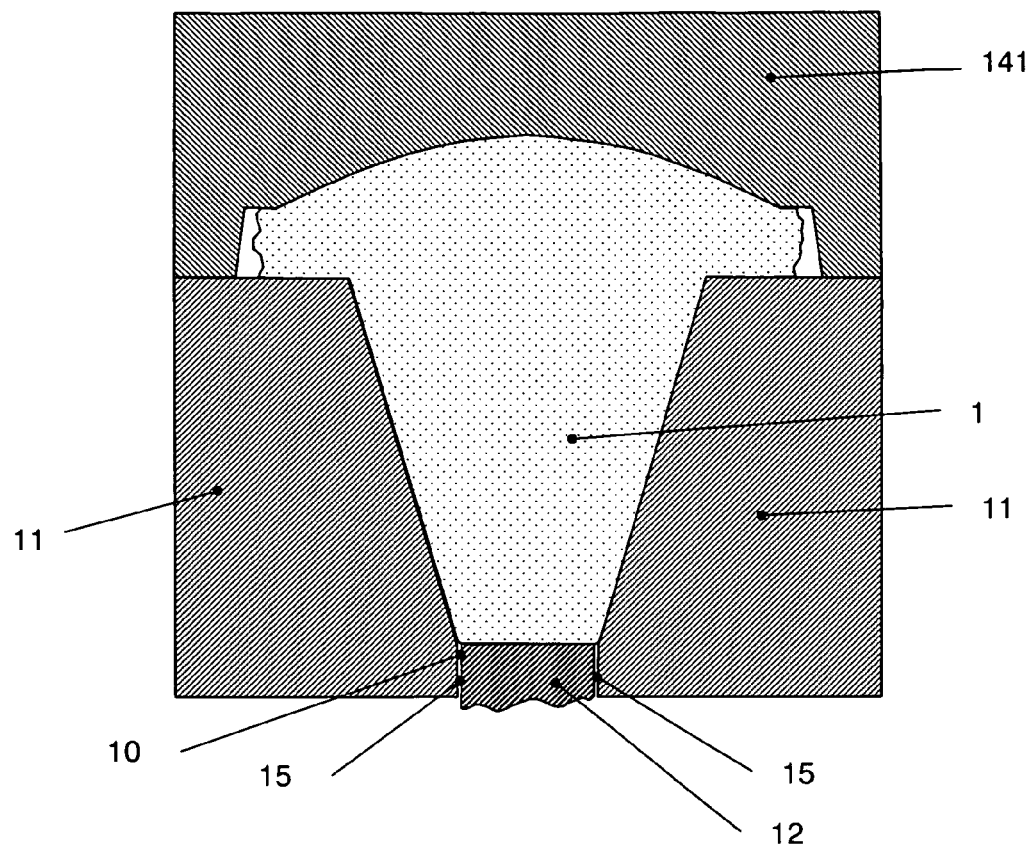
FIG. 6 shows an alternative method for manufacturing a solar concentrator in accordance with FIG. 3.

FIG. 6 shows an optional method for manufacturing a solar concentrator 1. Herein, the mold 14 is substituted by a mold 141 which firmly bears on the partial mold 11.

Figure 7:
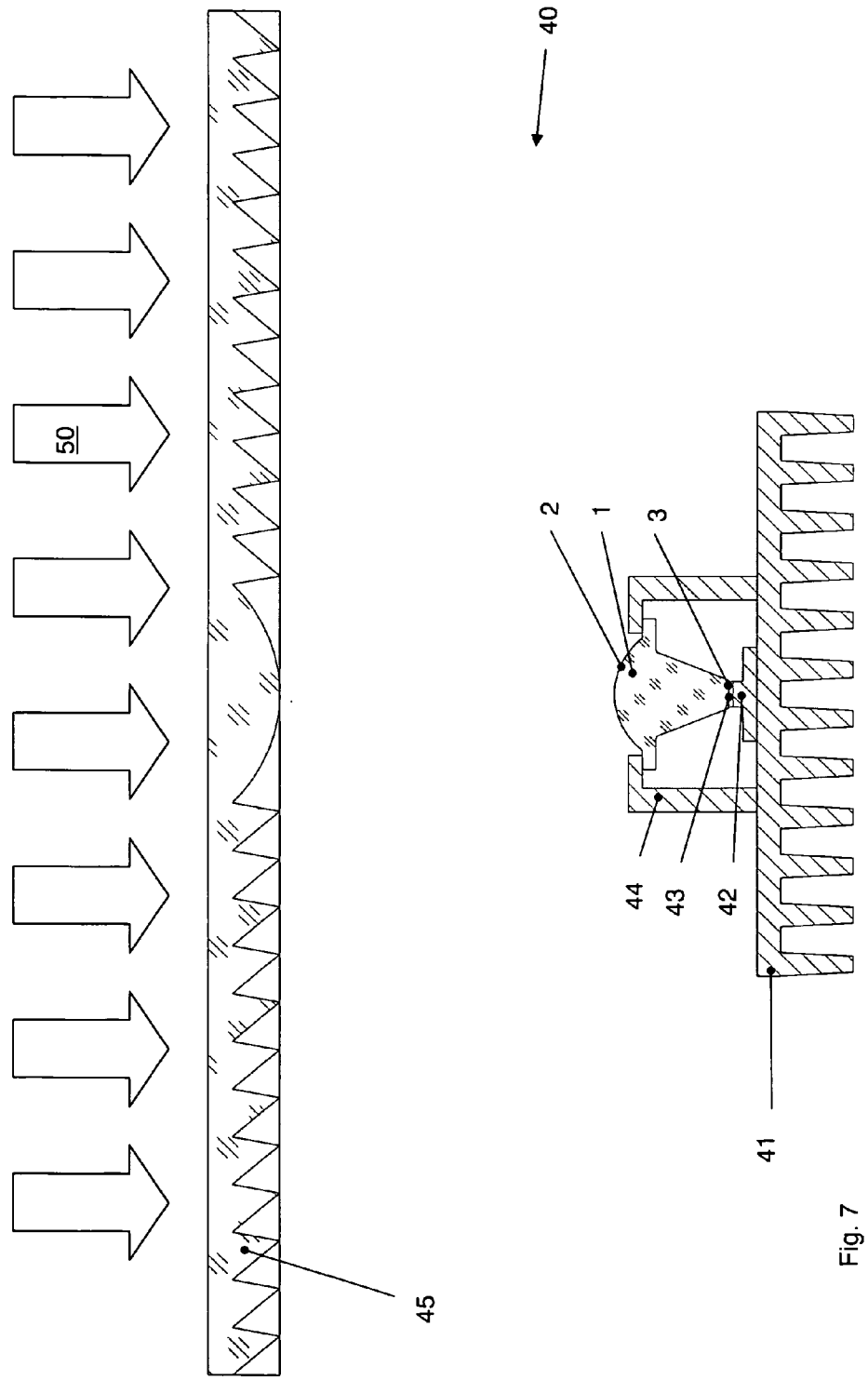
FIG. 7 shows an example of an embodiment of a solar module including a solar concentrator in accordance with the present invention.

FIG. 7 shows an example of embodiment of a solar module 40 including a solar concentrator 1 in accordance with the present invention. The solar module 40 comprises a cooling body 41 on which a photovoltaic element 42 and retention means 44 for the solar concentrator 1 are arranged. The light exit face 3 is connected to the photovoltaic element 42 by means of an adhesive material layer 43. The solar module 40 furthermore comprises a primary solar concentrator 45 designed as a Fresnel or drum lens for aligning sunlight 50 with the light entry face 2 of the solar concentrator 1 arranged or designed or provided, respectively, as a secondary solar concentrator. Sunlight fed into the solar concentrator 1 via the light entry face 2 exits via the light exit face 3 of the solar concentrator 1 and encounters the photovoltaic element 42.

Elements, dimensions and angles as used in FIGS. 3 to 6, respectively, have been drafted in consideration of simplicity and clarity and not necessarily to scale. For example, the orders of magnitude of some of the elements, dimensions and angles, respectively, have been exaggerated with regard to other elements, dimensions and angles, respectively, in order to enhance comprehension of the examples of embodiment of the present invention.

The invention claimed is:

1. A method for manufacturing a solar concentrator from transparent material having a light entry face, a light exit face and a light guide portion arranged between the light entry face and the light exit face and tapering in the direction of the light exit face, which light guide portion is restricted by a light guide portion surface between the light entry face and the light exit face, the method comprising the steps of:
   providing a first mold, adapted for molding the light entry face;
   providing at least a second mold, adapted for molding the light exit face;
   drawing the transparent material into the second mold by means of pressure below atmospheric pressure;
   press molding a transparent material between said first mold and said second mold for creating the solar concentrator, such that the light guide portion surface merges into the blank molded light exit face with a continuous first derivative, and
   further comprising the steps of:
   providing a photovoltaic element; and
   fixedly connecting said light exit face of said solar concentrator to said photovoltaic element.

2. The method of claim 1, wherein the transparent material is drawn into the second mold by means of the depression at least partially during said blank molding.

3. The method of claim 1, wherein the depression is at least 0.5 bar.

4. The method of claim 3, wherein immediately before molding, the transparent material has a viscosity of no more than $10^{4.5}$ (dPa)(s).

5. The method of claim 1, wherein immediately before molding, the transparent material has a viscosity of no more than $10^{4.5}$ (dPa)(s).

6. The method of claim 5, wherein the light exit face is not ground after press molding.

7. The method of claim 1, wherein the light exit face is not ground after press molding.

8. The method of claim 1, wherein the second mold is at least two-part.

9. The method of claim 1, wherein the second mold has a gap in the region forming the transition between the light exit face and the light guide portion surface.

10. The method of claim 9, wherein the gap has a width of between 10 μm and 40 μm.

11. The method of claim 10, wherein the depression is generated in said gap.

* * * * *